United States Patent
Ida

(10) Patent No.: US 10,447,164 B2
(45) Date of Patent: Oct. 15, 2019

(54) POWER SUPPLY VOLTAGE STABILIZING METHOD, SEMICONDUCTOR DEVICE, AND POWER SUPPLY SYSTEM

(71) Applicant: RENESAS ELECTRONICS CORPORATION, Tokyo (JP)

(72) Inventor: Masayuki Ida, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/178,268

(22) Filed: Nov. 1, 2018

(65) Prior Publication Data

US 2019/0199219 A1  Jun. 27, 2019

(30) Foreign Application Priority Data

Dec. 21, 2017  (JP) ................. 2017-244907

(51) Int. Cl.
*H02M 3/158* (2006.01)
*H03K 17/082* (2006.01)
(Continued)

(52) U.S. Cl.
CPC ...... *H02M 3/1588* (2013.01); *G01R 19/0092* (2013.01); *H01M 10/48* (2013.01); *H03K 17/0822* (2013.01)

(58) Field of Classification Search
CPC ............... H02M 3/1588; H01M 10/48; H03K 17/0822; G01R 19/0092
See application file for complete search history.

(56) References Cited

U.S. PATENT DOCUMENTS 8,421,441 B2  4/2013  Hirotsu et al.
8,471,543 B2  6/2013  Nakazono
(Continued)

FOREIGN PATENT DOCUMENTS

JP  2011-097434 A  5/2011
JP  2011-101479 A  5/2011

OTHER PUBLICATIONS

Extended European Search Report issued in corresponding European Patent Application No. 18207011.0-1202, dated Jan. 22, 2019.

*Primary Examiner* — Adolf D Berhane
*Assistant Examiner* — Afework S Demisse
(74) *Attorney, Agent, or Firm* — McDermott Will & Emery LLP

(57) ABSTRACT

An object of the present invention is to provide a power supply voltage stabilizing method that can suppress the performance of a switching power supply from being deteriorated even when a battery voltage varies and/or load conditions change. In a power supply voltage stabilizing method of a switching power supply including an output power MOS to which a battery voltage is supplied and a PWM feedback control unit that controls the output power MOS, the PWM feedback control unit includes a voltage feedback controller that controls on the basis of a power supply voltage output from the switching power supply and a current feedback controller that controls on the basis of a current output from the switching power supply. A variation in the battery voltage and/or a change in the load condition of the switching power supply are/is detected, and the bandwidth of the PWM feedback control unit is dynamically changed in accordance with the result of the detection.

20 Claims, 14 Drawing Sheets

(51) Int. Cl.
*G01R 19/00* (2006.01)
*H01M 10/48* (2006.01)

(56) References Cited

U.S. PATENT DOCUMENTS

2013/0214749 A1* 8/2013 Huang .................... G05F 1/595
 323/271
2015/0277460 A1 10/2015 Liu et al.

* cited by examiner

FIG. 3

| PARAMETER NO. | BATTERY VOLTAGE (V) | OUTPUT CURRENT (A) | CURRENT CONTROL PARAMETER 1 | CURRENT CONTROL PARAMETER 2 |
|---|---|---|---|---|
| #0 | NONSTANDARD | NONSTANDARD | 0000 (STOP) | 0000 (STOP) |
| #1 | LESS THAN 14V | 2A OR MORE AND LESS THAN 3A | 0101 | 01010 |
| #2 | LESS THAN 14V | 1A OR MORE AND LESS THAN 2A | 0110 | 01100 |
| #3 | LESS THAN 14V | 0 OR MORE AND LESS THAN 1A | 0111 | 01110 |
| #4 | 14V OR MORE AND LESS THAN 26V | 2A OR MORE AND LESS THAN 3A | 1000 | 10000 |
| #5 | 14V OR MORE AND LESS THAN 26V | 1A OR MORE AND LESS THAN 2A | 1001 | 10010 |
| #6 | 14V OR MORE AND LESS THAN 26V | 0 OR MORE AND LESS THAN 1A | 1010 | 10100 |
| #7 | 26V OR MORE AND LESS THAN 40V | 2A OR MORE AND LESS THAN 3A | 1011 | 10110 |
| #8 | 26V OR MORE AND LESS THAN 40V | 1A OR MORE AND LESS THAN 2A | 1100 | 11000 |
| #9 | 26V OR MORE AND LESS THAN 40V | 0 OR MORE AND LESS THAN 1A | 1101 | 11010 |

OUTPUT UNIT
CHARACTERISTICS

CURRENT
FEEDBACK CONTROL
CHARACTERISTICS

ENTIRE
CHARACTERISTICS

FIG. 10

| PARAMETER NO. | BATTERY VOLTAGE (V) | OUTPUT CURRENT (A) | VOLTAGE CONTROL PARAMETER 1 | VOLTAGE CONTROL PARAMETER 2 |
|---|---|---|---|---|
| #0 | NONSTANDARD | NONSTANDARD | 0000 (STOP) | 00000 (STOP) |
| #1 | LESS THAN 14V | 2A OR MORE AND LESS THAN 3A | 0101 | 01010 |
| #2 | LESS THAN 14V | 1A OR MORE AND LESS THAN 2A | 0110 | 01100 |
| #3 | LESS THAN 14V | 0 OR MORE AND LESS THAN 1A | 0111 | 01110 |
| #4 | 14V OR MORE AND LESS THAN 26V | 2A OR MORE AND LESS THAN 3A | 1000 | 10000 |
| #5 | 14V OR MORE AND LESS THAN 26V | 1A OR MORE AND LESS THAN 2A | 1001 | 10010 |
| #6 | 14V OR MORE AND LESS THAN 26V | 0 OR MORE AND LESS THAN 1A | 1010 | 10100 |
| #7 | 26V OR MORE AND LESS THAN 40V | 2A OR MORE AND LESS THAN 3A | 1011 | 10110 |
| #8 | 26V OR MORE AND LESS THAN 40V | 1A OR MORE AND LESS THAN 2A | 1100 | 11000 |
| #9 | 26V OR MORE AND LESS THAN 40V | 0 OR MORE AND LESS THAN 1A | 1101 | 11010 |

FIG. 11

| CORRECTION VALUE | CURRENT FEEDBACK PARAMETER 1_C | CURRENT FEEDBACK PARAMETER 2_C | VOLTAGE FEEDBACK PARAMETER 1_C | VOLTAGE FEEDBACK PARAMETER 2_C |
|---|---|---|---|---|
| -9% | 001 | 001 | 001 | 001 |
| -6% | 010 | 010 | 010 | 010 |
| -3% | 011 | 011 | 011 | 011 |
| Default | 100 | 100 | 100 | 100 |
| +3% | 101 | 101 | 101 | 101 |
| +6% | 110 | 110 | 110 | 110 |
| +9% | 111 | 111 | 111 | 111 | even

POWER SUPPLY VOLTAGE STABILIZING METHOD, SEMICONDUCTOR DEVICE, AND POWER SUPPLY SYSTEM

CROSS-REFERENCE TO RELATED APPLICATIONS

The disclosure of Japanese Patent Application No. 2017-244907 filed on Dec. 21, 2017 including the specification, drawings and abstract is incorporated herein by reference in its entirety.

BACKGROUND

The present invention relates to a power supply voltage stabilizing method, a semiconductor device, and a power supply system suitable for a battery, and relates to, for example, a power supply voltage stabilizing method for a battery mounted in an automobile and the like.

A battery is mounted in, for example, an automobile, and electricity fed from the battery to a cell motor for starting an engine, an engine controller (hereinafter, referred to as an ECU), and the like. Various types of electronic devices are mounted in the ECU. A battery voltage from the battery is stabilized by a power supply circuit such as a switching power supply, a stabilized output voltage is fed from the power supply circuit to the electronic devices mounted in the ECU, and the electronic devices are operated using the fed output voltage as a power supply voltage.

In order to realize the stabilized output voltage, the switching power supply includes a voltage feedback unit that feeds back the output voltage of the switching power supply to a switching control unit, and a current feedback unit that stabilizes the output voltage at a high speed. The switching power supply is described in, for example, Japanese Unexamined Patent Application Publication No. 2011-101479 and Japanese Unexamined Patent Application Publication No. 2011-97434.

SUMMARY

The battery voltage of a battery mounted in an automobile always varies. For example, when a cell motor is activated to start (turn on) an engine, a current flowing in the cell motor is increased, and a voltage drop is increased at a harness that couples the cell motor to the battery. Thus, the battery voltage fed to the switching power supply is suddenly changed. Further, since the current flowing in the cell motor is gradually decreased after the activation, the battery voltage fed to the switching power supply is gradually changed. Thus, the battery voltage varies with the lapse of time. Such a variation in the battery voltage is large, and the voltage drop is standardized in the ISO standard.

FIG. 14 is a characteristic diagram for showing changes in battery voltage caused by a voltage drop presented by the ISO standard. In the drawing, the horizontal axis represents time, and the vertical axis represents a battery voltage. Here, the battery voltage is 12 (V). In the case where an engine is turned on at time ton, the battery voltage is suddenly decreased from 12 (V) to reach 3.6(v) or 2.6(V) in a period of time t1. Thereafter, the battery voltage gradually rises with the lapse of time (t2 and t3).

The in-vehicle switching power supply forms a stabilized output voltage from such a battery voltage that varies.

The following is a configuration example of the switching power supply described in Japanese Unexamined Patent Application Publication No. 2011-101479. Here, the configuration example will be described with reference to FIG. 2 of Japanese Unexamined Patent Application Publication No. 2011-101479. In the following description, the reference numerals in parentheses correspond to those used in FIG. 2 of Japanese Unexamined Patent Application Publication No. 2011-101479. It should be noted that the switching power supply is referred to as a DC-DC converter in Japanese Unexamined Patent Application Publication No. 2011-101479. However, the switching power supply is used as it is in this specification.

The switching power supply includes an error amplifier (17), a slope compensation circuit (13), a PWM comparator (21), an RS latch (22), output power MOSs (24 and 25), an output power MOS driving driver (23), and the like. The error amplifier (17) compares a voltage on the basis of an output voltage (VOUT) with an output of an output voltage DAC (12), and configures a voltage feedback unit that controls the output power MOSs (24 and 25). Further, the PWM comparator (21) compares a difference between an output of the error amplifier (17) and an output of the slope compensation circuit (13) with coil current information (or switch current information), and configures a current feedback unit that controls the output power MOSs (24 and 25). Namely, the switching power supply is configured using a PWM feedback control unit including the voltage feedback unit and the current feedback unit.

In order to stabilize the output voltage of the switching power supply, the characteristics of the PWM feedback control unit are important. Specifically, it is important to set the gain and phase of the PWM feedback control unit so as not to oscillate. Namely, it is important to set a sufficient phase shift (phase margin) for 180 (degrees) that is an oscillation condition in a frequency region where a gain can be obtained.

In the case of Japanese Unexamined Patent Application Publication No. 2011-101479, a phase compensation resistor (18) and a phase compensation capacitor (19) are provided as phase compensation circuits that compensate the phase shift of the PWM feedback control unit. In the case where such a switching power supply is mounted in an automobile, the values of the phase compensation resistor (18) and the phase compensation capacitor (19) are set so as to stabilize the PWM feedback characteristics of the PWM feedback control unit in order to stabilize the output voltage of the switching power supply.

As described above, the in-vehicle battery voltage varies. FIG. 14 shows an example in which the battery voltage varies from 12(V) to 3.6(V). However, the battery voltage varies, for example, from 40(V) to 3.2(V) in practical use. Further, along with operations of electronic devices in the ECU, an output current (load current) supplied from the switching power supply to the electronic devices also varies. The characteristics of the output power MOSs (24 and 25) and/or the output power MOS driving driver (23) are changed due to a variation in the battery voltage and/or a change in the load current. When the characteristics of the output power MOSs and/or the output power MOS driving driver are changed, the PWM feedback characteristics of the PWM feedback control unit are changed. Thus, the phase margin of the PWM feedback control unit is changed.

The values of the phase compensation resistor and the phase compensation capacitor are set so that the phase margin is optimized at the time on the basis of a predetermined load current at a predetermined battery voltage. Therefore, for example, it is conceivable that when the battery voltage varies to reach the maximum or minimum voltage value, the phase margin is not optimized. If the phase margin is not appropriate, for example, a variation in the battery voltage appears in the output voltage of the switching power supply, and it is difficult to suppress the variation. In this case, electronic devices (a processor and the like), an in-vehicle sensor, and the like that are operated using the output voltage of the switching power supply as a power supply voltage are desirably operated to cause a malfunction, leading to system down in the worst case.

FIG. 13 are characteristic diagrams each showing the characteristics of the switching power supply when the battery voltage and the load current are changed without changing the values of the phase compensation resistor and the phase compensation capacitor, namely, without changing the characteristics of the phase compensation circuit. FIG. 13A shows a case in which the battery voltage is 14(V) and the load current is 4 (A), and FIG. 13B shows a case in which the battery voltage is changed to 26(V) and the load current is changed to 8 (A). In each of FIGS. 13A and 13B, the horizontal axis represents a frequency, the vertical axis on the left side represents the gain of the PWM feedback control unit, and the vertical axis on the right side represents the phase of the PWM feedback control unit. On the horizontal axis, for example, 1E+2 Hz indicates 100 (Hz) (the square of 10 (Hz)), and 1E+3 Hz indicates 1000 (Hz) (the cube of 10 (Hz)). Hereinafter, the frequency will be represented in the similar format.

In each of FIGS. 13A and 13B, the solid line represents the gain, and the dashed line represents the phase. In FIG. 13A, in a period of time when the PWM feedback control unit has a gain, namely, a period of time (1E+2 (Hz) to about 1E+4 (Hz)) when the gain curve (solid line) exceeds 0 (dB), the phase is about 120 (degrees) smaller than 180 (degrees) that is an oscillation condition. On the contrary, when the battery voltage and the load current are changed, the maximum phase reaches 190 (degrees) in a period of time (1E+2 (Hz) to about 1E+4 (Hz)) when the PWM feedback control unit has a gain as shown in FIG. 13B. In this case, the phase exceeds the oscillation condition, and it is conceivable that the PWM feedback control unit oscillates, possible leading to system down.

A problem caused by a variation in the battery voltage is not recognized in Japanese Unexamined Patent Application Publication No. 2011-101479. Further, Japanese Unexamined Patent Application Publication No. 2011-97434 shows that a variation in the gain and offset of a current detection circuit is corrected, but does not recognize a problem caused by a variation in the battery voltage.

The other problems and novel features will become apparent from the description of the specification and the accompanying drawings.

The following is a semiconductor device according to an embodiment.

Namely, in a power supply voltage stabilizing method of a power supply circuit including a switch to which a battery voltage is supplied and a PWM feedback control unit that controls the switch, the PWM feedback control unit includes a voltage feedback controller that controls on the basis of a power supply voltage output from the power supply circuit and a current feedback controller that controls on the basis of a current output from the power supply circuit. A variation in the battery voltage and/or a change in the load condition of the power supply circuit are/is detected, and the bandwidth of the PWM feedback control unit is dynamically changed in accordance with the result of the detection.

The bandwidth of the PWM feedback control unit is represented by the gain and the phase of the PWM feedback control unit. By dynamically changing the gain and/or the phase, it is possible to provide PWM feedback characteristics suitable for a variation in the battery voltage and/or a change in the load conditions.

According to an embodiment, it is possible to provide a power supply voltage stabilizing method that can suppress the performance of a power supply circuit from being deteriorated even when a battery voltage varies and/or load conditions change.

BRIEF DESCRIPTION OF THE DRAWINGS

FIG. 3 is a diagram for showing a table included in a parameter controller according to the first embodiment;

FIG. 10 is a diagram for showing a voltage table according to the fourth embodiment;

FIG. 11 is a diagram for showing a correction table according to a fifth embodiment;

DETAILED DESCRIPTION

Figure 1:
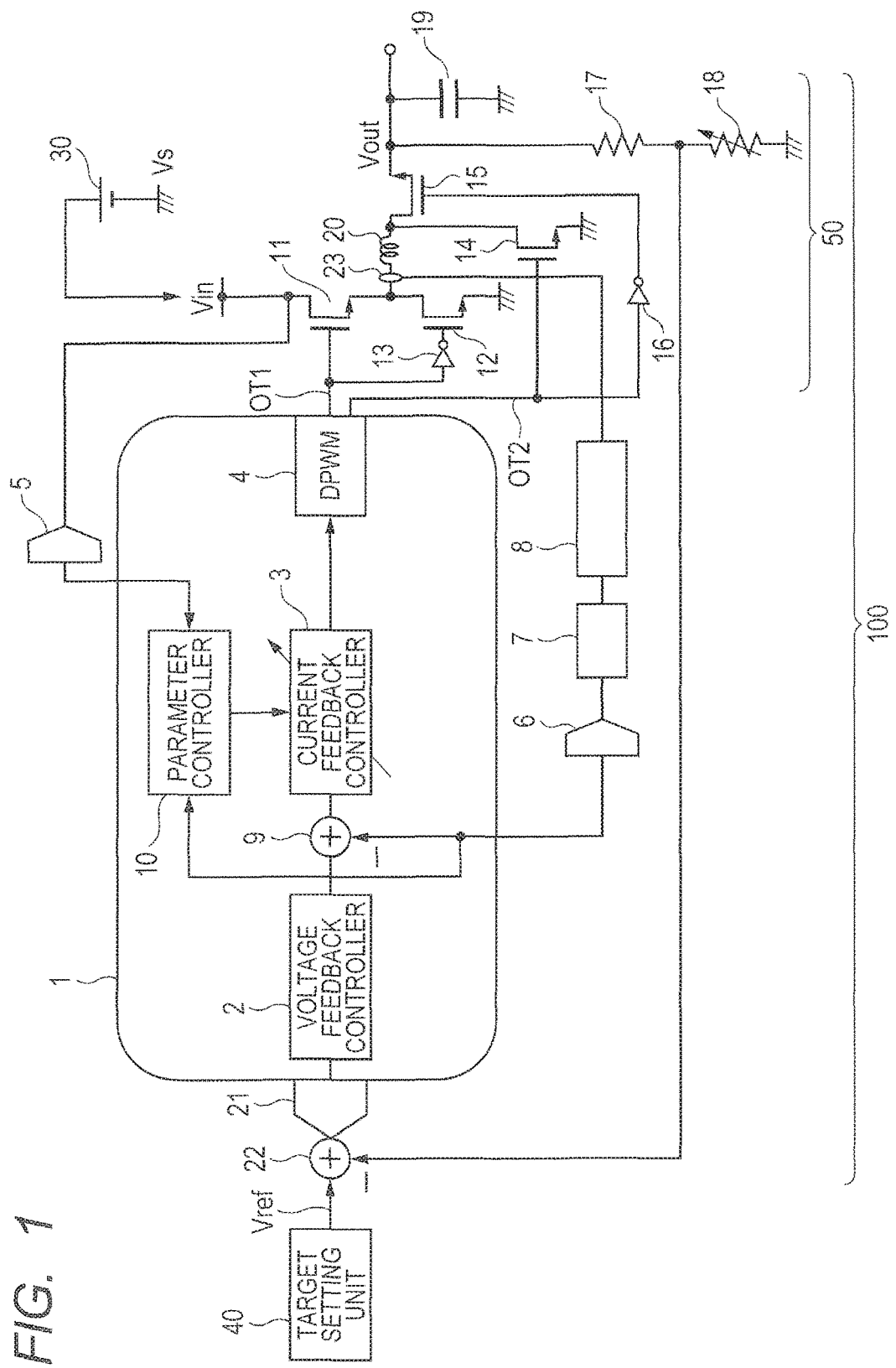
FIG. 1 is a block diagram for showing a configuration of a switching power supply according to a first embodiment.

Hereinafter, embodiments of the present invention will be described with reference to the drawings. It should be noted that the disclosure is only an example, and matters that are appropriately changed while maintaining the gist of the invention and that a person skilled in the art can easily arrive at are naturally included in the scope of the present invention. Further, the width, thickness, shape, and the like of each unit are schematically shown in the drawings in some cases as compared to the actual mode in order to more clarify the explanation. However, these are only examples, and do not limit the interpretation of the present invention.

Further, elements similar to those already described in the drawing that has been previously shown are followed by the same signs in the specification and each drawing, and the detailed explanation thereof will be appropriately omitted in some cases.

In the following description, a switching power supply is configured using a digital circuit as an example. However, the present invention is not limited to this. Namely, the switching power supply may be configured using the analog circuit as shown in, for example, Japanese Unexamined Patent Application Publication No. 2011-101479. However, the switching power supply is desirably configured using a digital circuit from the viewpoint of easiness of realization. Further, the present invention will be described using an in-vehicle switching power supply as an example.

First Embodiment

<Configuration of Switching Power Supply>

FIG. 1 is a block diagram for showing a configuration of a switching power supply according to a first embodiment. A switching power supply (power supply circuit) 100 includes a semiconductor device 1 and a plurality of electronic parts coupled to the semiconductor device 1. A battery 30 is coupled to the switching power supply 100, and a battery voltage Vin is fed from the battery 30. Further, a target voltage value Vref is supplied from a target setting unit 40 to the switching power supply 100, and the switching power supply 100 forms a voltage corresponding to the target voltage value Vref from the battery voltage Vin to be output as an output voltage (hereinafter, also referred to as a power supply voltage) Vout. Although not shown in the drawing, the battery 30 is also coupled to a cell motor and the like through a harness, and the battery voltage is fed as the power supply voltage for the cell motor and the like. On the other hand, the output voltage Vout of the switching power supply 100 is fed to an electronic device, a sensor, and the like in the ECU as the power supply voltage.

The semiconductor device 1 includes a Digitally adjusted Pulse-Width Modulation (hereinafter, referred to as a pulse width modulator or DPWM) 4, a current feedback controller 3, a voltage feedback controller 2, a parameter controller 10, and an adder 9. Although not particularly limited, these circuit blocks are formed in one semiconductor chip by a well-known semiconductor manufacturing technique to form the semiconductor device 1. In order to configure the switching power supply 100, analog/digital conversion circuits (hereinafter, referred to as A/D conversion circuits) 5, 6, and 21, an adder 22, a sensor 8, a low-pass filter 7, resistors 17 and 18, and a voltage output circuit 50 are provided outside the semiconductor device 1.

Although not particularly limited, the voltage output circuit 50 includes four N-channel MOSFETs (field effect transistors, and the N-channel MOSFET will be, hereinafter, also simply referred to as a MOS) 11, 12, 14, and 15, inverter circuits 13 and 16, an inductance 20, and a capacitance 19. The source of a power MOS for output (hereinafter, referred to as an output power MOS or switch) 11 is coupled to the drain of the output power MOS 12, and a coupling node between the output power MOS 11 and the output power MOS 12 is coupled to the drain of the MOS 15 through a current dividing unit 23 and the inductance 20. A coupling node between the inductance 20 and the drain of the MOS 15 is coupled to a ground voltage Vs through the MOS 14, and the source of the MOS 15 is coupled to the ground voltage Vs through a smoothing capacitance 19. A coupling node between the source of the MOS 15 and the smoothing capacitance 19 serves as an output node of the switching power supply 100, and the output voltage Vout is output from the output node.

The source of the output power MOS 12 is coupled to the ground voltage Vs, and a first output signal OT1 of the DPWM 4 is supplied to the gate of the output power MOS 12 through an inverter circuit 13. On the other hand, the first output signal OT1 of the DPWM 4 is supplied to the gate of the output power MOS 11. Further, a second output signal OT2 of the DPWM 4 is supplied to the gate of the MOS 15 through an inverter circuit 16, and the second output signal OT2 of the DPWM 4 is supplied to the gate of the MOS 14.

The DPWM 4 outputs the first output signal OT1 and the second output signal OT2 each having a pulse width in accordance with a potential difference between the battery voltage Vin and the target voltage value Vref by PWM feedback control. The output power MOSs 11 and 12 complementarily become ON/OFF states by the first output signal OT1. Namely, when the output power MOS 11 (12) is in the ON state, the output power MOS 12 (11) becomes the OFF state. Likewise, the MOSs 14 and 15 complementarily become ON/OFF states by the second output signal OT2. For example, when the output power MOS 11 and MOS 14 become the ON state, a current in accordance with the battery voltage Vin flows from the battery voltage Vin towards the ground voltage Vs through the current dividing unit 23 and the inductance 20. During the period, the MOS 15 becomes the OFF state, and the voltage Vout is output to the output node by electric charges accumulated in the smoothing capacitance 19. On the other hand, when the output power MOS 12 and MOS 15 become the ON state, a current flow from the ground voltage Vs towards the output node through the inductance 20 and the current dividing unit 23. During the period, the MOS 14 becomes the OFF state, electric charges are charged to the smoothing capacitance 19 by the output node current, and the voltage Vout is also output. The above-described operation is repeated in accordance with the first output signal OT1 and the second output signal OT2 output from the DPWM 4, and the output voltage Vout in the output node becomes a voltage value corresponding to the target voltage Vref.

The resistors 17 and 18 are coupled in series between the output node and the ground voltage Vs. The resistors 17 and 18 function as voltage dividing resistors that divide the output voltage Vout. Namely, the output voltage Vout is divided by the resistors 17 and 18. The voltage obtained by the voltage division is supplied to the negative input of the adder 22 as a detected voltage. In the embodiment, the resistor 18 is a variable resistor. Therefore, the value of the detected voltage supplied to the negative input of the adder 22 can be changed by changing the resistance value of the resistor 18.

The adder 22 adds the target voltage value Vref output from the target setting unit 40 to the detected voltage. Since the detected voltage is supplied to the negative input, the adder 22 functions to subtract the detected voltage from the target voltage value Vref. The potential difference obtained by the subtraction is supplied to the A/D conversion circuit 21 to be converted into a digital signal, which is then supplied to the voltage feedback controller 2 in the semiconductor device 1 as an output voltage for PWM feedback control. The voltage feedback controller 2 supplies an output signal on the basis of the supplied output voltage for PWM feedback control to the adder 9.

The current dividing unit 23 divides a load current flowing in the inductance 20, and the detected current obtained by the current division is supplied to the sensor 8. Although not particularly limited, the sensor 8 converts the detected current into a voltage, and the voltage (hereinafter, referred to as a detected current voltage or a current detection signal) obtained by the conversion is supplied to the low-pass filter 7. The detected current voltage through the low-pass filter 7 is converted into a digital signal by the A/D conversion circuit 6 to be supplied to the negative input of the adder 9.

The adder 9 subtracts the digital signal corresponding to the detected current voltage from the output signal output from the voltage feedback controller 2, and supplies the result to the current feedback controller 3. The current feedback controller 3 forms an output signal on the basis of a difference between the output signal from the voltage feedback controller 2 and the digital signal corresponding to the detected current voltage, and supplies the output signal to the DPWM 4.

The voltage feedback control is performed so as to minimize the difference between the target voltage value Vref and the voltage value of the output voltage Vout. In the embodiment, the route of the voltage feedback control is configured by the adder 22, the A/D conversion circuit 21, the voltage feedback controller 2, the DPWM 4, and the voltage output circuit 50. In the voltage feedback control, the voltage output circuit 50 is controlled so as to reduce the difference between the detected voltage formed by the voltage division and the target voltage Vref.

On the other hand, in the current feedback control, the output voltage Vout is controlled to be stabilized by controlling the load current output from the switching power supply. In the embodiment, the route of the current feedback control is configured by the adder 9, the current feedback controller 3, the DPWM 4, the output power MOSs 11 and 12, the sensor 8, the low-pass filter 7, and the A/D conversion circuit 6. In this case, in the current feedback control, the voltage output circuit 50 is controlled so as to reduce the difference between the detected current voltage obtained by the current division and the output signal from the voltage feedback controller 2. As described above, a PWM feedback control unit in the switching power supply 100 according to the embodiment includes a voltage feedback control unit that performs the voltage feedback control and a current feedback control unit that performs the current feedback control. Further, the voltage feedback control unit includes the voltage feedback controller 2, and the current feedback control unit includes the current feedback controller 3.

In the embodiment, the current feedback controller 3 is configured using a variable-type current feedback controller, and the characteristics thereof are set in accordance with the value of a parameter supplied from the parameter controller 10. The characteristics of the PWM feedback control unit are changed by changing the characteristics of the current feedback controller in accordance with the value of the parameter.

A plurality of parameters is preliminarily set to the parameter controller 10 according to the embodiment. The parameter controller 10 selects one of the set parameters in accordance with the operation state of the switching power supply 10 at the time, and sets the value of the selected parameter to the current feedback controller 3. As information to detect the operation state of the switching power supply 100, the parameter controller 10 uses information related to the battery voltage Vin and information related to the load current. Accordingly, the characteristics of the current feedback controller 3 are dynamically changed in accordance with a variation in the battery voltage Vin and/or a change in the load current (load condition), and the characteristics of the PWM feedback control unit are also dynamically changed as a result.

Specifically, the battery voltage Vin is converted into a digital signal by the A/D conversion circuit 5, and a battery detection signal obtained by the conversion and the above-described detected current voltage are supplied to the parameter controller 10. Here, the battery detection signal is information related to the battery voltage Vin, and the detected current voltage is information related to the load current. The parameter controller 10 selects a parameter on the basis of the battery detection signal and the detected current voltage to be set to the current feedback controller 3. Since the parameter controller 10 changes the parameter set to the current feedback controller 3 to a new parameter, the parameter controller 10 can be regarded as dynamically rewriting the parameter of the current feedback controller 3. In the description, the battery detection signal and the detected current voltage are used as detection signals to detect a variation in the battery voltage Vin and a change in the load current as an example. However, the present invention is not limited to this. It should be noted that the detected current voltage is shared in both of the current feedback control and the change of the parameter in the embodiment.

By rewriting the parameter of the current feedback controller 3, the output signal output from the current feedback controller 3 is changed, and the first output signal OT1 and the second output signal OT2 output from the DPWM 4 are changed. Accordingly, the bandwidth that is the characteristic of the PWM feedback control unit is changed to be optimum for the operation state of the switching power supply 100 at the time. More specifically, since the bandwidth is defined by the gain and the phase of the PWM feedback control unit, the gain and the phase of the PWM feedback control unit are changed to optimum values by rewriting the parameter of the current feedback controller 3.

Next, concrete examples of the current feedback controller 3 and the parameter controller 10 will be described. First, a configuration of the current feedback controller 3 will be described. In the following description, one parameter is configured using two current control parameters, namely, a current control parameter 1 and a current control parameter 2.

<Configuration of Current Feedback Controller>

Figure 2:
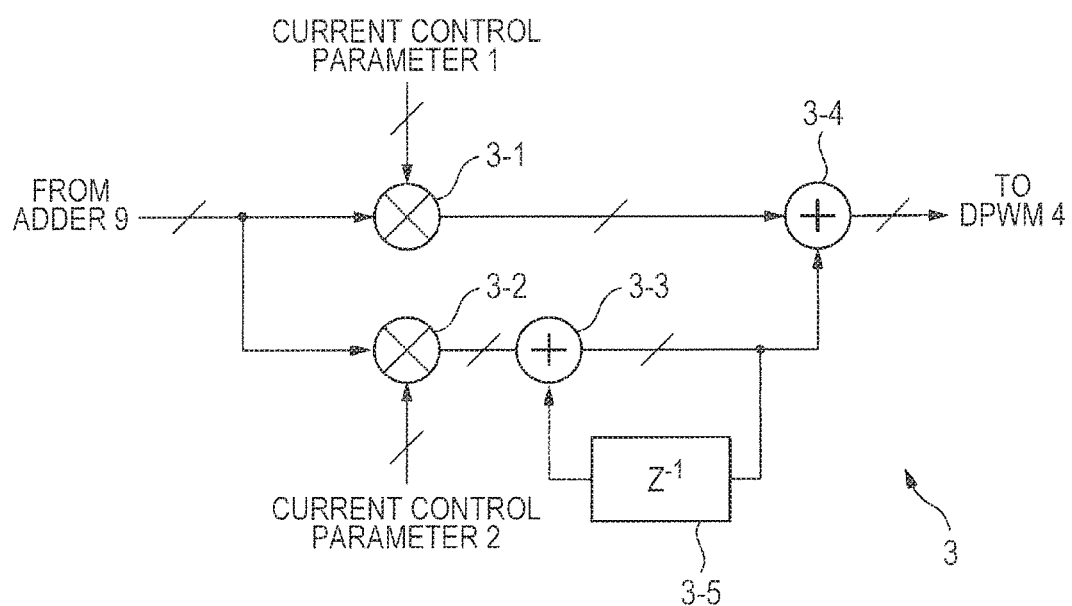
FIG. 2 is a block diagram for showing a configuration of a current feedback controller according to the first embodiment.

FIG. 2 is a block diagram for showing a configuration of the current feedback controller according to the first embodiment. In the drawing, 3-1 and 3-2 denote multipliers, 3-3 and 3-4 denote adders, and 3-5 denotes a delay circuit ($Z^{-1}$). It should be noted that oblique lines added to the signal lines mean that a plurality of signals exists.

A signal output from the adder 9 is branched into two, and one signal is supplied to the multiplier 3-1. The other signal is supplied to the multiplier 3-2. The multiplier 3-1 multiplies the current control parameter 1 by the supplied signal, and supplies the multiplication result to the adder 3-4. The multiplier 3-2 multiplies the current control parameter 2 by the supplied signal, and supplies the multiplication result to the adder 3-3. An output of the adder 3-3 is supplied to the delay circuit 3-5 as well as the adder 3-4. A signal delayed by the delay circuit 3-5 is supplied to the adder 3-3. Accordingly, the adder 3-3 performs an addition operation with the signal delayed by one cycle. The adder 3-4 adds the signal from the multiplier 3-1 to the signal from the adder 3-3, and outputs the addition result to the DPWM 4 as an output signal of the current feedback controller 3.

In the current feedback controller 3 according to the embodiment, the gain is mainly adjusted by the current control parameter 1, and the phase is mainly adjusted by the current control parameters 1 and 2.

<Parameter Controller>

A plurality of parameters is preliminarily set to the parameter controller 10. More specifically, the parameter controller 10 includes a table in which a plurality of parameters is set. FIG. 3 is a diagram for showing the table included in the parameter controller according to the first embodiment. Items of the table are "parameter No.", "battery voltage Vin (V)", "output current (A)", "current control parameter 1", and "current control parameter 2". Here, the output current (A) indicates a current output from the switching power supply 100, and the current corresponds to the load current.

In the table, the output current, the current control parameter 1, and the current control parameter 2 are set for each battery voltage. Namely, the output current is classified for each battery voltage, and the current control parameter 1 and the current control parameter 2 are set for each output current. For example, in the case where the battery voltage Vin is less than 14(V) as an example, the output currents are classified into "2 (A) or more and less than 3 (A)", "1 (A) or more and less than 2 (A)", and "0 (A) or more and less than 1 (A)". In the case where the output current is 2 (A) or more and less than 3 (A) in this classification, the current control parameter 1 is "0101", and the current control parameter 2 is "01010". In the case where the output current is 1 (A) or more and less than 2 (A), the current control parameter 1 is "0110", and the current control parameter 2 is "01100". Further, in the case where the output current is 0 (A) or more and less than 1 (A), the current control parameter 1 is "0111", and the current control parameter 2 is "01110".

Thereafter, the current control parameters 1 and 2 are set while being classified in a range of the output current for each battery voltage Vin (14(V) or more and less than 26(V) and 26(V) or more and less than 40(V)) in the same manner.

In addition, when the battery voltage Vin is, for example, 40(V) or more, the battery voltage falls outside the standard of the switching power supply 100. In consideration of a case in which the battery voltage falls outside the standard, the battery voltages, the load currents, and the corresponding current control parameters 1 and 2 in the case of the nonstandard are set in the table.

The values of the current control parameters 1 and 2 are preliminarily calculated so that the bandwidth of the PWM feedback control unit is optimized with the battery voltage and the output current at the time, and are stored in the table shown in FIG. 3.

<Rewrite of Parameter>

The parameter controller 10 searches the table shown in FIG. 3 on the basis of the battery detection signal supplied from the A/D conversion circuit 5 and the detected current voltage supplied from the A/D conversion circuit 6, and selects the parameter No. The parameter controller 10 rewrites the parameter so that the current control parameters 1 and 2 corresponding to the selected parameter No. are supplied to the multipliers 3-1 and 3-2 shown in FIG. 2.

For example, in the case where the output current changes between 2 (A) and 3 (A) in a situation where "0110" of the current control parameter 1 and "01100" of the current control parameter 2 corresponding to the parameter No.#2 are set to the current feedback controller 3, the parameter controller 10 recognizes the change using the detected current voltage, and selects the parameter No.#1 corresponding to the changed output current to change the current control parameters 1 and 2 to "0101" and "01010", respectively. Accordingly, the current control parameters 1 and 2 of the current feedback controller 3 are rewritten into the current control parameters corresponding to the selected parameter No. Although an example in which the current control parameters 1 and 2 corresponding to the parameter No.#1 are rewritten has been shown, the same applies to cases of other parameter Nos.

Further, in the case where a variation in the battery voltage Vin is detected using the battery detection signal, the parameter No. corresponding to the varied battery voltage Vin is similarly searched in the table, and the parameters of the current feedback controller 3 are rewritten into the current control parameters 1 and 2 corresponding to the selected parameter No.

In the case where the battery voltage Vin largely varies, the parameter controller 10 may determine that an error occurs and stop the operation of the switching power supply 100 by selecting the parameter No.#0. For example, in the case where the battery voltage Vin represented by the battery detection signal is changed to a value in a different voltage range in the table, the parameter controller 10 determines that the battery voltage Vin has largely varied, and selects the parameter No.#0. As an example, in the case where a variation in the battery voltage Vin from less than 14(V) to 14(V) or more that falls in a different voltage range has been detected, the parameter controller 10 selects the parameter No.#0. When the parameter No.#0 is selected, the current control parameters 1 and 2 to stop the current feedback controller 3 are supplied to the current feedback controller 3, and the current control parameters of the current feedback controller 3 are rewritten into the current control parameters 1 and 2 (to stop the current feedback controller 3). Accordingly, the current feedback controller 3 stops, and as a result, the switching power supply 100 stops.

Likewise, in the case where the battery detection signal indicates a voltage of 40(V) or more and/or in the case where the detected current voltage indicates a current of 3 (A) or more, the parameter controller 10 writes "0000" and "00000" representing "stop" as the values of the current control parameters 1 and 2, and stops the operation of the switching power supply 100.

Figure 4A:
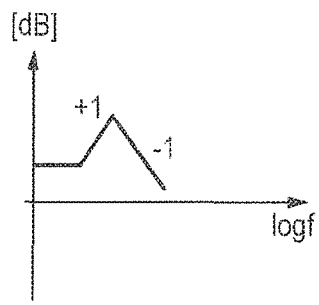
FIGS. 4A to 4C are characteristic diagrams each explaining the characteristics of the switching power supply according to the first embodiment.
Figure 4B:
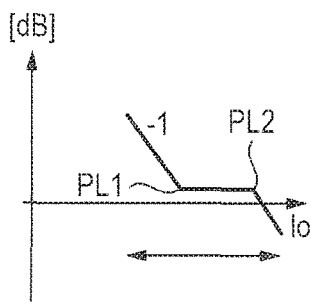
Figure 4C:
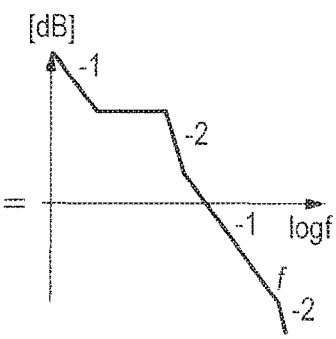

FIG. 4 are characteristic diagrams each explaining the gain-frequency characteristics of the PWM feedback control unit according to the first embodiment. In each drawing, the horizontal axis represents a frequency, and the vertical axis represents again. FIG. 4A shows the gain-frequency characteristics of the voltage feedback controller 2 in an open-loop state, and FIG. 4B shows the gain-frequency characteristics of the current feedback controller 3 in an open-loop state. The gain characteristics of the PWM feedback control unit in an open-loop state can be obtained by mixing the gain characteristics of the voltage feedback controller 2 in an open-loop state shown in FIG. 4A with the gain characteristics of the current feedback controller 3 in an open-loop state shown in FIG. 4B. FIG. 4C shows the gain-frequency characteristics of the PWM feedback control unit in an open-loop state.

By changing the current control parameters 1 and 2, poles PL1 and PL2 that are change points of the characteristics shown in FIG. 4B move in the frequency direction (horizontal axis direction). Accordingly, the gain-frequency characteristics of the PWM feedback control unit also move along the frequency, and the optimum characteristics can be realized as a whole.

Figure 13A:
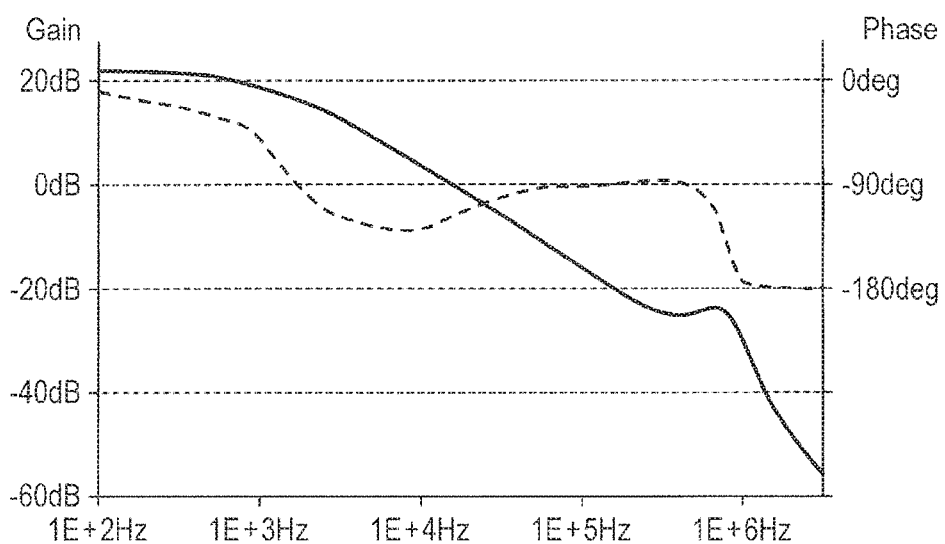
FIGS. 13A and 13B are characteristic diagrams each showing the characteristics of a switching power supply.

FIG. 5 are characteristic diagrams each explaining the characteristics of the switching power supply according to the first embodiment. In each of FIG. 5, the horizontal axis represents a frequency, the vertical axis on the left side represents a gain, and the vertical axis on the right side represents a phase. As similar to FIG. 13, the solid line represents a change in gain and the dashed line represents a change in phase in each of FIG. 5.

Figure 5A:
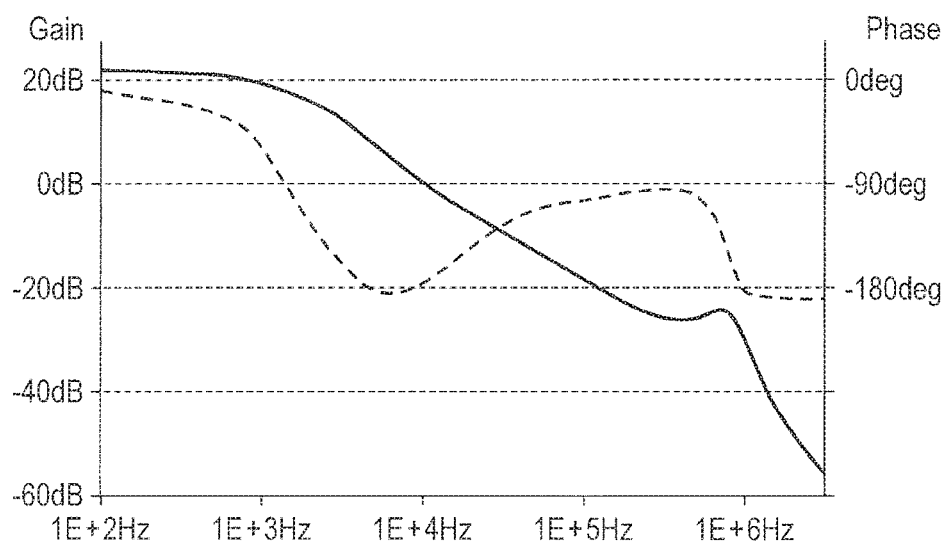
FIGS. 5A and 5B are characteristic diagrams each explaining the frequency characteristics of the switching power supply according to the first embodiment.
Figure 13B:
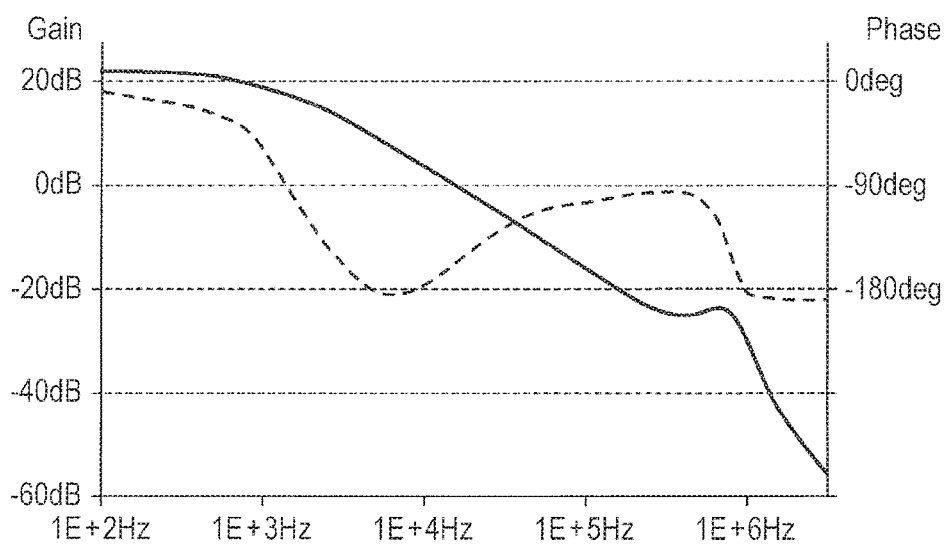

FIG. 5A shows the characteristics same as FIG. 13B. Namely, FIG. 5A shows the gain characteristics and the phase characteristics when a state in which the output current of the switching power supply 100 is 4 (A) while the battery voltage is 14(V) is changed to a state in which the output current is 8 (A) while the battery voltage is 26(V) as described in FIG. 13B. As described in FIG. 13B, there is a concern about an oscillation state because the phase becomes about 190 (degrees) in a frequency period where the gain exceeds 0 (dB).

Figure 5B:
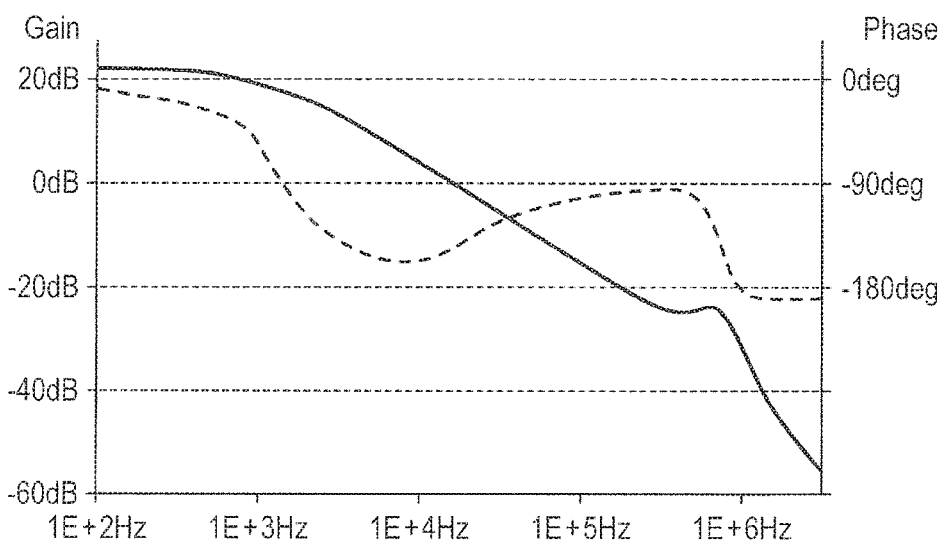

On the contrary, when the battery voltage Vin and the output current are changed in the switching power supply 100 according to the embodiment, the current control parameters 1 and 2 are accordingly changed, and the parameters of the current feedback controller 3 are rewritten. Accordingly, the poles PL1 and PL2 shown in FIG. 4B move, and the gain characteristics and the phase characteristics of the PWM feedback control unit in the switching power supply 100 are changed. Accordingly, as shown in FIG. 5B, the frequency at which the gain becomes lower than 0 (dB) becomes slightly higher than 1E+4 (Hz), and the maximum phase at which the gain exceeds 0 (dB) is nearly 150 (degrees) as shown by the dashed line. In this case, since the oscillation conditions are not satisfied, it is possible to prevent the switching power supply 100 from oscillating, and the performance of the switching power supply can be improved.

Namely, the phase that deviates due to a variation in the battery voltage Vin and a change in the output current can be recovered so as to be closer to the optimum phase. For example, the output current of the switching power supply 100 is changed when the load conditions of the switching power supply 100 are changed. According to the embodiment, even if the output current is changed, the current control parameters 1 and 2 are dynamically rewritten, and the phase of the PWM feedback control unit can be closer to the maximum value. Therefore, a period of time required to converge a variation in the output voltage of the switching power supply 100 that occurs due to the deviation of the phase can be shortened, and the performance of the switching power supply 100 can be improved.

Further, in the embodiment, the current feedback controller 3 and the voltage feedback controller 2 are configured using digital circuits. These controllers can be configured using general analog circuits. However, it is difficult to configure the controllers using general analog circuits in consideration of the circuit scale and the like, and thus it is desirable to configure the controllers using digital circuits.

Second Embodiment

Figure 6:
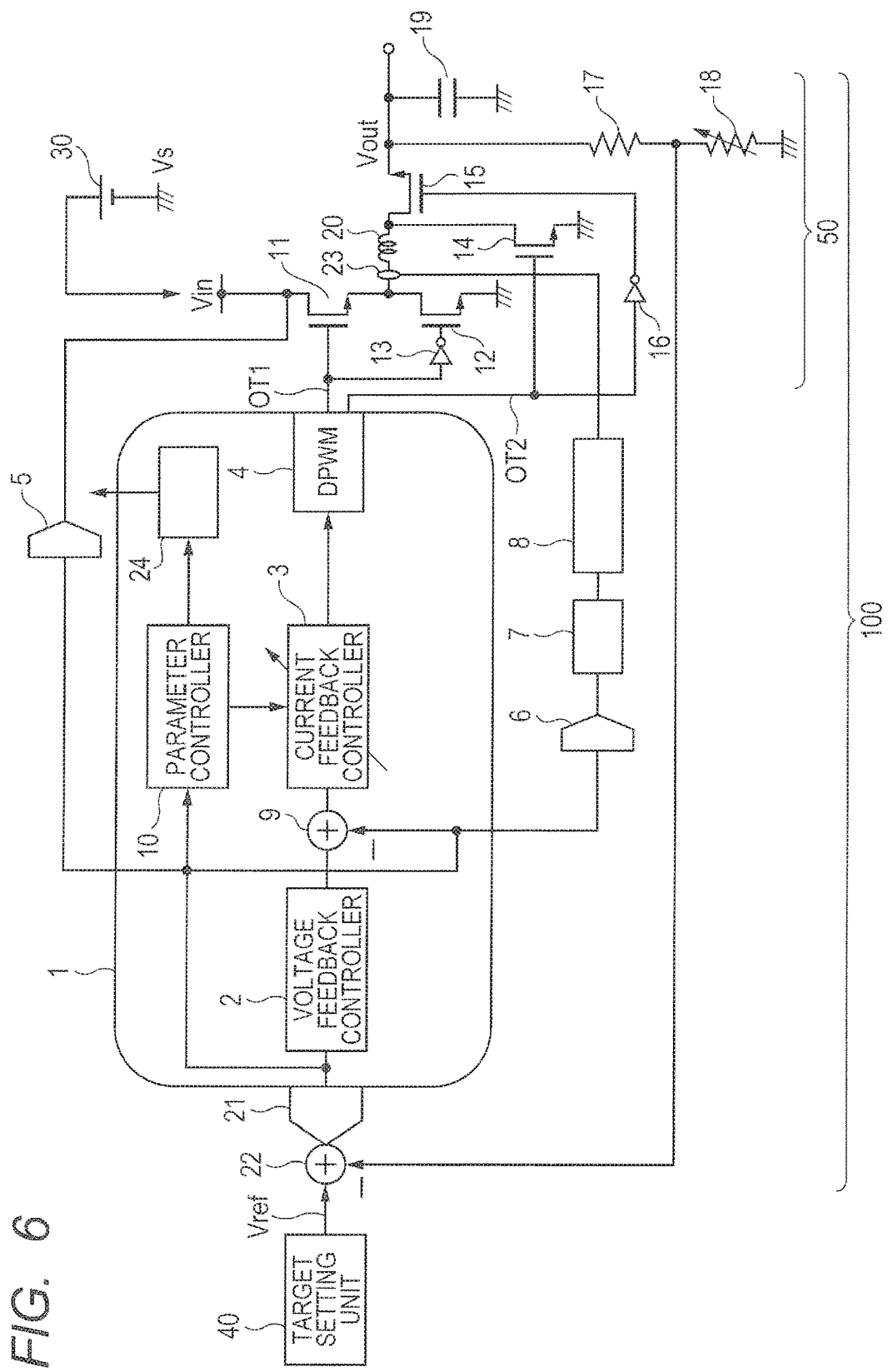
FIG. 6 is a block diagram for showing a configuration of a switching power supply according to a second embodiment.

FIG. 6 is a block diagram for showing a configuration of a switching power supply according to a second embodiment. Since FIG. 6 is similar to FIG. 1, different points will be mainly described.

In the switching power supply shown in FIG. 1, the parameter controller 10 uniquely selects parameters from the battery voltage Vin and the output current, and rewrites the parameters of the current feedback controller 3. On the contrary, in the switching power supply 100 according to the embodiment, a signal monitored by the parameter controller 10 is added. Namely, a signal on the basis of the ripple level of the output voltage Vout of the switching power supply 100 is supplied to the parameter controller 10. Accordingly, the parameter controller 10 selects parameters in accordance with the battery voltage Vin, the output current, and the ripple level, and rewrites the parameters of the current feedback controller 3.

Further, in the embodiment, the parameter controller 10 detects whether or not the ripple level has exceeded a predetermined parameter setting limit. In the case where the ripple level has exceeded the predetermined parameter setting limit, the switching power supply 100 is stopped. At this time, the semiconductor device 1 notifies the outside of the state of the switching power supply 100.

The semiconductor device 1 shown in FIG. 6 is different from that shown in FIG. 1 that the output signal (the output voltage for PWM feedback control) of the A/D conversion circuit 21 is supplied to the parameter controller 10 as a signal for monitoring the ripple level of the output voltage Vout. Further, the semiconductor device 1 shown in FIG. 6 is different from that shown in FIG. 1 that an interface circuit 24 is added.

The A/D conversion circuit 21 outputs a digital signal in accordance with a difference between a divided voltage of the output voltage Vout and the target voltage Vref. Therefore, when the ripple is superimposed on the output voltage Vout, the output signal of the A/D conversion circuit 21 is changed in accordance with the superimposed ripple level.

The parameter controller 10 selects parameters in accordance with the ripple level indicated by the output signal of the A/D conversion circuit 21, and the parameters of the current feedback controller 3 are rewritten into the selected parameters. As a result of the selection of the parameters, the gain of the current feedback control is mainly adjusted by the parameter 1, and the phase can be mainly adjusted by the parameters 1 and 2, and the appropriate characteristics for the switching power supply can be realized. At this time, the parameters selected by the parameter controller 10 are those obtained by subdividing the parameters shown in FIG. 3.

Next, the subdivision parameters selected by the parameter controller 10 in accordance with the ripple level will be described. Here, the subdivision parameters will be described using the parameter No.#1 shown in FIG. 3 as an example. Each of the current control parameters 1 and 2 corresponding to the parameter No.#1 is subdivided into 19 pieces (+9 to 0 to −9) at the same interval. Among the 19 subdivision parameters obtained by the subdivision, the subdivision parameter No. of the subdivision parameter having the central value is assumed as ##0, the subdivision parameter Nos. are assumed as ##+1 to ##+9 in the direction in which the value is increased, and the subdivision parameter Nos. are assumed as ##−1 to ##−9 in the direction in which the value is decreased.

A predetermined first threshold value for the ripple level and a predetermined second threshold value smaller than the first threshold value are set to the parameter controller 10. A case in which the parameter corresponding to the parameter No.#1 is written into the current feedback controller 3 by the parameter controller 10 will be described as an example. As default, the parameter controller 10 writes the current control parameters 1 and 2 corresponding to the subdivision parameter No.##0 into the current feedback controller 3. Accordingly, as default, the characteristics of the PWM feedback control unit are set in accordance with the central value of the parameter No.#1.

The parameter controller 10 compares the ripple level indicated by the output signal of the A/D conversion circuit 21 with the set first threshold value. In the case where the ripple level exceeds the first threshold value, the parameter controller 10 adds 1 to the subdivision parameter No., and selects the subdivision parameter corresponding to the subdivision parameter No. with 1 added. Then, the parameter controller 10 writes the subdivision parameter into the current feedback controller 3. Namely, the parameter controller 10 selects the subdivision parameter No.##+1, and writes the current control parameters 1 and 2 corresponding to the subdivision parameter No.##+1 into the current feedback controller 3. Accordingly, the characteristics of the current feedback controller 3 and the PWM feedback control unit are changed in accordance with the ripple level.

In the case where the parameter controller 10 determines that the ripple level has been lowered to less than the second threshold value, the parameter controller 10 subtracts 1 from the subdivision parameter No., and selects the subdivision parameter corresponding to the subdivision parameter No. with 1 subtracted. Then, the parameter controller 10 writes the subdivision parameter into the current feedback controller 3. Namely, the parameter controller 10 selects the subdivision parameter No.##0, and writes the current control parameters 1 and 2 corresponding to the subdivision parameter No.##0 into the current feedback controller 3. Accordingly, the characteristics of the PWM feedback control unit are set in accordance with the central value of the parameter No.#1. Accordingly, the characteristics of the current feedback controller 3 and the PWM feedback control unit are returned to the defaults. Namely, the current control parameters 1 and 2 are automatically changed on the basis of the detection of the ripple level.

As the ripple level is increased in the +direction, the parameter controller 10 selects a subdivision parameter towards the subdivision parameter ##+9, and writes the same into the current feedback controller 3. On the contrary, as the ripple level is increased in the −direction, the parameter controller 10 selects a subdivision parameter towards the subdivision parameter ##−9, and writes the same into the current feedback controller 3.

In the case where the ripple level is changed in the +direction or the −direction and the parameter controller 10 selects a subdivision parameter over the subdivision parameter No.##+9 or ##−9, the parameter controller 10 determines that the ripple level exceeds the parameter setting limit, and selects the parameter No.#0. By selecting the parameter No.#0 and writing the current control parameters 1 and 2 corresponding to the parameter NO.#0 into the current feedback controller 3, the current feedback controller 3 and the PWM feedback control unit stop the operation, and the switching power supply 100 stops the operation. At this time, the parameter controller 10 notifies the outside of the semiconductor device 1 of the state at this time, for example, the fact that the parameter No.#0 is selected or the ripple level exceeds the parameter setting limit through the interface circuit 24. The fail-safe can be provided to a system using the switching power supply 100 by notifying the outside of the semiconductor device 1.

Although the embodiment has been described using the parameter No.#1 as an example, the same applies to other parameters No.#2 to #9.

Although the embodiment has been described using the 19 subdivision parameters as an example, the present invention is not limited to the number. The parameter setting limit is not limited to the subdivision parameter No.##−9 or ##+9. It should be noted that, for example, bits that can represent 19 states are added to the current control parameters 1 and 2 shown in FIG. 3, and the added bits may be written into the current feedback controller 3 as the current control parameters 1 and 2 in the subdivision parameters.

In the embodiment, the second threshold value is smaller than the first threshold value as described above. Therefore, the state can be more easily returned to the default state against a change in the ripple level. This is because the default state is a stabler state. It is obvious that the first threshold value may be equal to the second threshold value, or the second threshold value may be larger than the first threshold value.

In the embodiment, the characteristics of the PWM feedback control unit are dynamically changed by monitoring the ripple level of the output voltage Vout of the switching power supply 100. Therefore, the switching power supply 100 can stably supply the output voltage Vout against a change on the load side other than a change in the output current output from the switching power supply 100. Further, in the case where a change on the load side is large and the ripple level exceeds the parameter setting limit, the fail-safe can be provided to the system, and the safety can be improved.

Third Embodiment

In each of the first and second embodiments, the result of the PWM feedback control unit is fed back to the process of rewriting the parameters of the current feedback controller 3 by supplying the result of the PWM feedback control unit to the parameter controller 10. Since the parameters are rewritten in response to the feedback, it is conceivable that a delay occurs until the result is reflected, and the switching power supply 100 becomes unstable. When the switching power supply 100 becomes unstable and the output voltage Vout becomes unstable, there is concern that an operation of a processor that operates with the output voltage Vout of the switching power supply 100 becomes unstable, or an output of a sensor that operates with the output voltage Vout of the switching power supply 100 becomes inaccurate.

In the embodiment, the processor sets a current control parameter suitable for a current needed in a process to be executed next to an event. Accordingly, the parameters of the current feedback controller 3 can be rewritten in not a feedback process but a feedforward process, and it is possible to suppress the switching power supply from becoming unstable. Next, a system according the embodiment will be described using the drawings.

Figure 7:
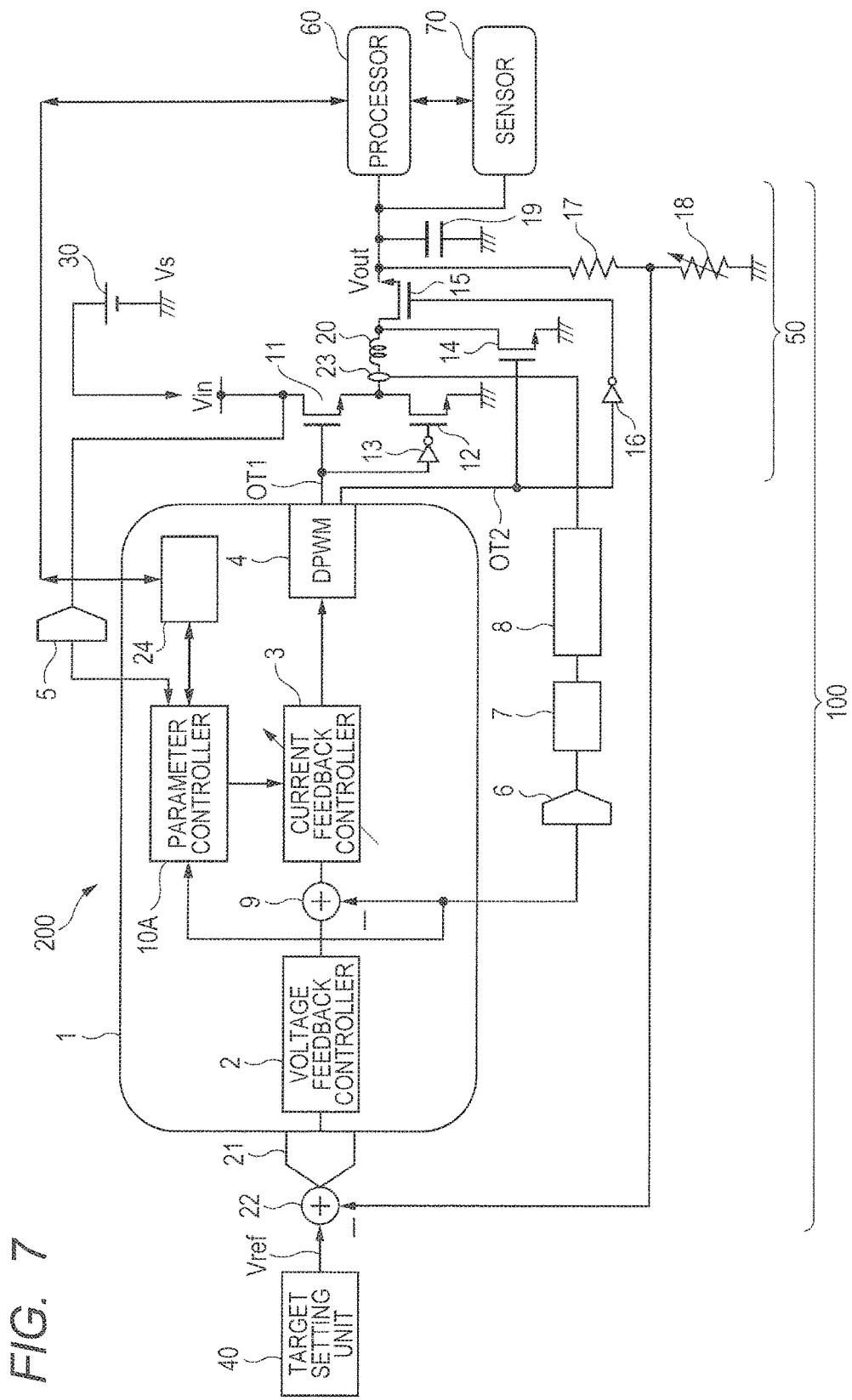
FIG. 7 is a block diagram for showing a configuration of a power supply system according to a third embodiment.

FIG. 7 is a block diagram for showing a configuration of a power supply system according to a third embodiment. FIG. 7 shows a switching power supply 100 and a power supply system 200 including peripheral devices such as a processor 60 and a sensor 70 that operate using the output voltage Vout from the switching power supply 100 as a power supply voltage. The processor 60 is provided in, for example, an ECU, and the sensor 70 is mounted in, for example, an automobile. A signal is transmitted and received between the sensor 70 and the processor 60. For example, the processor 60 transmits a signal for instructing to obtain vehicle information to the sensor 70, and the vehicle information obtained by the sensor 70 is supplied to the processor 60 as a signal. The processor 60 processes the received vehicle information.

A configuration of the switching power supply 100 is similar to that of the switching power supply shown in FIG. 1, and thus different points will be mainly described. As the different points, an interface circuit 24 is added to the semiconductor device 1, and the parameter controller 10 is changed to a parameter controller 10A.

As similar to the parameter controller 10 described in the first embodiment, the parameter controller 10A has a function of selecting a parameter No. on the basis of the battery detection signal from the A/D conversion circuit 5 and the detected current voltage from the A/D conversion circuit 6 to rewrite the parameters of the current feedback controller 3 into the current control parameters 1 and 2 corresponding to the selected parameter No. Further, the parameter controller 10A further has a function in which a power supply parameter setting instruction is received from the processor 60 through the interface circuit 24, a parameter No. is selected in accordance with the received power supply parameter setting instruction, and the parameters of the current feedback controller 3 are rewritten into the current control parameters corresponding to the selected parameter No. Namely, in the parameter controller 10A, for example, one of the parameters No.#1 to #9 shown in FIG. 3 is instructed by the power supply parameter setting instruction (for example, #1 is instructed). The parameter controller 10A writes the current control parameters 1 and 2 corresponding to the instructed parameter No.#1 into the current feedback controller 3.

Further, in the case where the parameter controller 10A selects the parameter No.#0, the parameter controller 10A stops the operation of the switching power supply 100, and notifies the processor 60 of the fact that an abnormality has occurred through the interface circuit 24.

<Operation of Processor>

Figure 8:
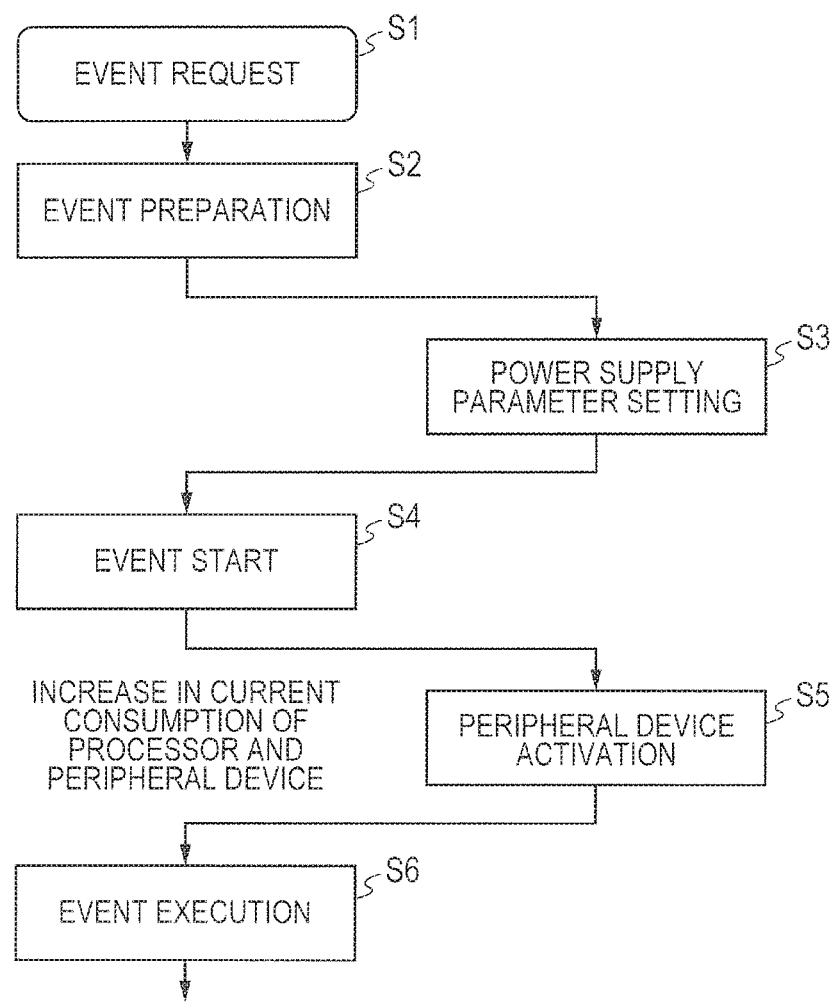
FIG. 8 is a flowchart for explaining an operation of a processor according to the third embodiment.

FIG. 8 is a flowchart for explaining an operation of the processor according to the third embodiment. The processor 60 accepts an event request in Step S1. As the event, for example, an engine is started, or a cell motor or the like is turned on. Next, the processor 60 prepares for the accepted event request in Step S2.

In the execution of Step S2, the processor 60 estimates power consumption required for processes of the peripheral devices such as the sensor 70 to be operated and the processor 60. The processor 60 supplies the parameter No. corresponding to the estimated power consumption to the semiconductor device 1 as the power supply parameter setting instruction in Step S3. In the semiconductor device 1, the supplied power supply parameter setting instruction is supplied to the parameter controller 10A through the interface circuit 24. The parameter controller 10A selects the parameter No. in accordance with the power supply parameter setting instruction, and rewrites the parameters of the current feedback controller 3 into the current control parameters 1 and 2 corresponding to the selected parameter No.

Next, in Step S4, the processor 60 starts the process of the event accepted in Step S1. Since the peripheral devices such as the sensor 70 need to be activated to process the event, the processor 60 activates the peripheral devices in Step S5. At this time, since the peripheral devices and the like are activated, the load current of the switching power supply 100 is increased. The parameters of the current feedback controller 3 are optimally changed in advance in accordance with an increase in power consumption in Step S3. Thus, the switching power supply 100 can be stably operated even in Step S5.

Thereafter, the accepted event is executed in Step S6.

Figure 14:
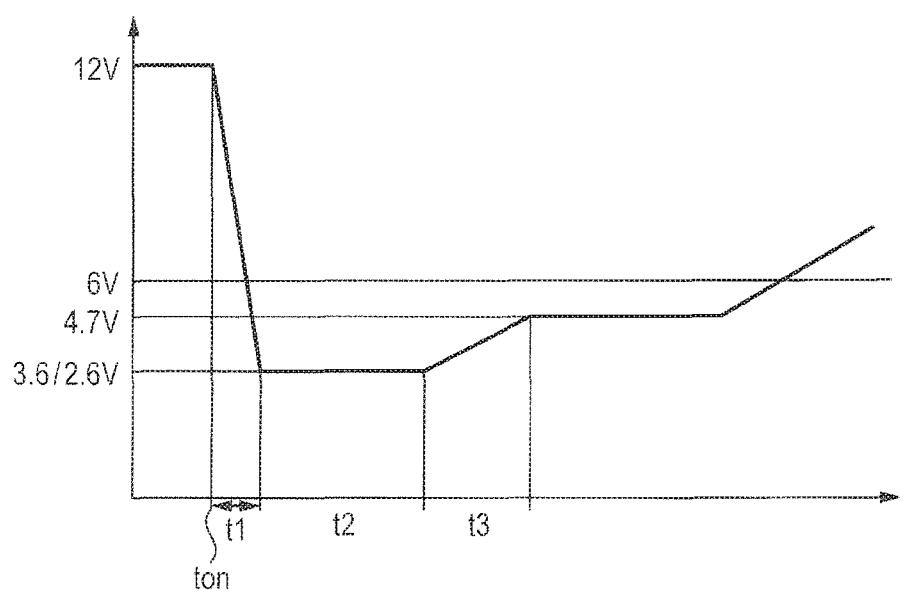
FIG. 14 is a characteristic diagram for showing changes in battery voltage.

In the third embodiment, the parameters corresponding to the load current to be preliminarily needed are written into the current feedback controller 3 in advance. Namely, the parameters of the current feedback controller 3 are written by the feedforward process. Therefore, as compared to a case in which the parameters are written by the feedback process, the switching power supply 100 can more stably feed the output voltage to the processor 60 and the peripheral devices in the power supply system 200 as a power supply voltage, and the performance of the system can be improved. For example, in the case of the event request to start the engine in S1, the processor 60 or the parameter controller 10A can predict a decrease in the battery voltage in advance as shown in FIG. 14, and thus the disturbance of the power supply control when starting the engine can be prevented.

In the case where unexpected load or failure occurs and the parameter controller 10A selects the parameter No.#0, an error is notified to the processor 60 through the interface circuit 24, and thus the processor 60 can detect an abnormality. In response to the notified abnormality, the processor 60 can immediately interrupt the event that is in process or stop the power supply system 200. Safety is required for an in-vehicle system, and thus the power supply system 200 that can immediately handle is especially useful as an in-vehicle system.

Fourth Embodiment

An example of rewriting the parameters of the current feedback controller 3 has been shown in each of the first to third embodiments. However, the parameters of both of the current feedback controller 3 and the voltage feedback controller 2 are rewritten in a fourth embodiment.

Figure 9:
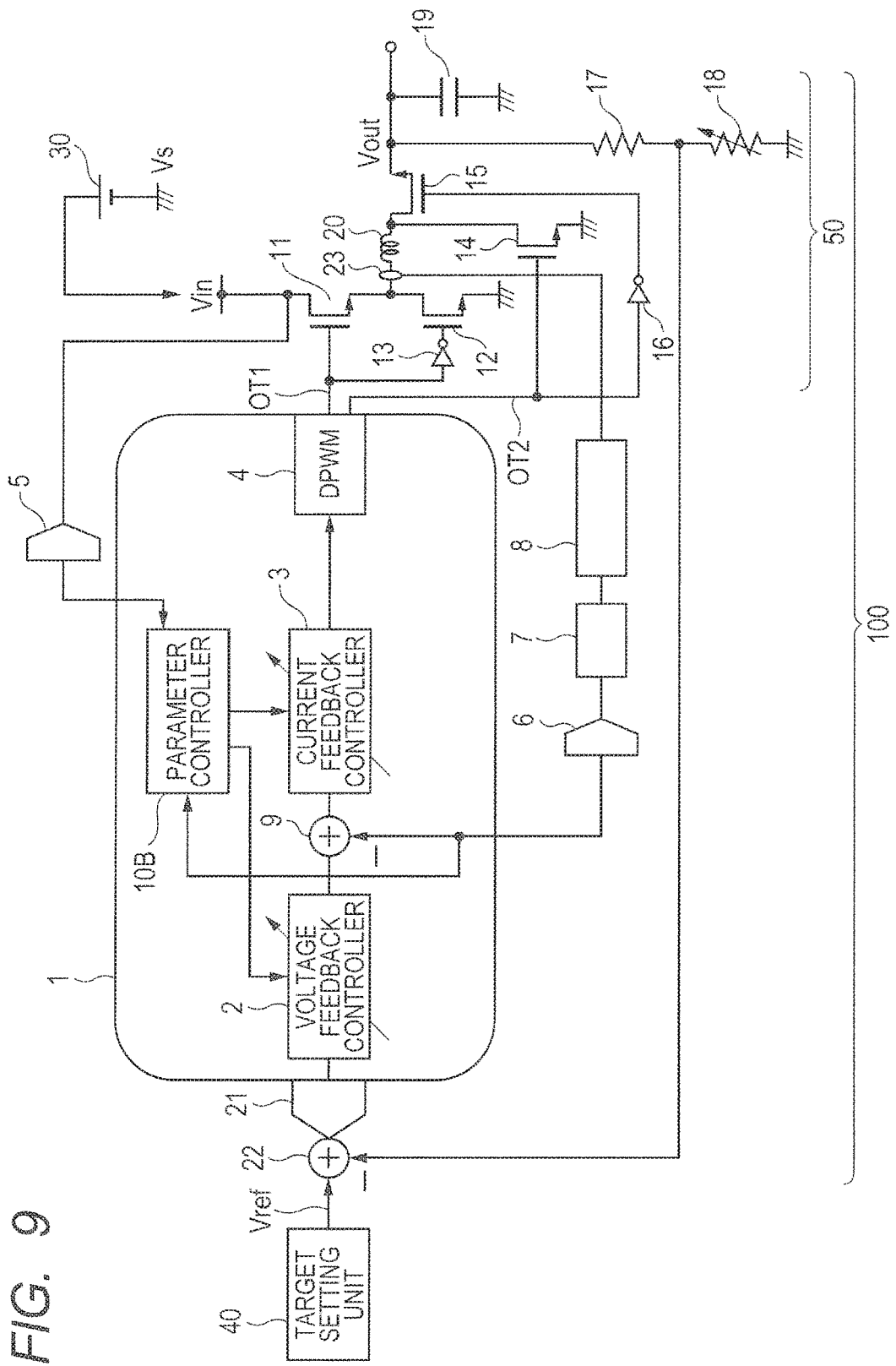
FIG. 9 is a block diagram for showing a configuration of a switching power supply according to a fourth embodiment.

FIG. 9 is a block diagram for showing a configuration of a switching power supply according to the fourth embodiment. Since FIG. 9 is similar to FIG. 1, different points will be mainly described. As the different points, the parameter controller 10 shown in FIG. 1 is changed to a parameter controller 10B, and the voltage feedback controller 2 is changed to a variable-type voltage feedback controller.

The gain-frequency characteristics of the voltage feedback controller 2 according to the embodiment are set by two voltage control parameters as similar to the current feedback controller 3 described in FIG. 2. Namely, the gain-frequency characteristics of the voltage feedback controller 2 can be dynamically changed by changing the two voltage control parameters.

The parameter controller 10B separately includes a table corresponding to the current feedback controller 3 and a table corresponding to the voltage feedback controller 2. In order to distinguish the two tables from each other, the table corresponding to the current feedback controller 3 will be hereinafter referred to as a current table, and the table corresponding to the voltage feedback controller 2 will be hereinafter referred to as a voltage table.

The parameter controller 10B selects parameters from the current table and the voltage table on the basis of the battery detection signal from the A/D conversion circuit 5 and the detected current voltage from the A/D conversion circuit 6, and rewrites the parameters of the current feedback controller 3 into the current control parameters 1 and 2 corresponding to the parameter No. selected from the current table. The rewriting of the parameters of the current feedback controller 3 is the same as that in the first embodiment, and thus the explanation thereof will be omitted.

FIG. 10 is a diagram for showing the voltage table according to the fourth embodiment. The voltage table includes five items as similar to the table shown in FIG. 3, and voltage control parameters 1 and 2 are provided as the items instead of the current control parameters 1 and 2. Except that the current control parameters 1 and 2 are replaced by the voltage control parameters 1 and 2, the voltage table is the same as the current table (the table shown in FIG. 3), and thus the explanation thereof will be omitted. It should be noted that the values of the voltage control parameters 1 and 2 shown in FIG. 10 are the same as those of the voltage control parameters 1 and 2 shown in FIG. 3 in order to simplify the explanation. However, it is obvious that the values may be different from each other.

The parameter controller 10B rewrites the parameters of the voltage feedback control unit 2 into the voltage control parameters 1 and 2 corresponding to the parameter No. selected from the voltage table shown in FIG. 10. Accordingly, the gain-frequency characteristics of the voltage feedback controller 2 are changed.

According to the embodiment, the characteristics of both of the current feedback controller 3 and the voltage feedback controller 2 are dynamically changed. Therefore, the characteristics of the PWM feedback control unit can be dynamically and more finely changed.

<Current Control Parameters 1 and 2 and Voltage Control Parameters 1 and 2>

Here, the current control parameters 1 and 2 and the voltage control parameters 1 and 2 will be described.

The current feedback controller 3 can be regarded as being configured using a proportional circuit that proportionally processes the inductance current amount and the target current amount of an output current, and an integration circuit that integrates the difference therebetween. In such a case, the proportional circuit determines the process gain using the current control parameter 1. Further, the integration circuit determines the phase using the current control parameters 1 and 2.

Therefore, as described above, the gain of the current feedback control unit 3 is mainly adjusted by the current control parameter 1, and the phase of the current feedback control unit 3 is mainly adjusted by the current control parameters 1 and 2.

Likewise, the voltage feedback controller 2 can be also regarded as being configured using a proportional circuit and an integration circuit. In such a case, the proportional circuit determines the process gain using the voltage control parameter 1, and the integration circuit determines the phase using the voltage control parameters 1 and 2. Thus, as similar to the current control parameters 1 and 2, the gain of the voltage feedback control unit 2 is mainly adjusted by the voltage control parameter 1, and the phase of the voltage feedback control unit 2 is mainly adjusted by the voltage control parameters 1 and 2.

Fifth Embodiment

In the embodiment, a configuration in which the ripple level is monitored in a steady state to correct the initial variation of the switching power supply 100 will be described. By correcting the initial variation, the characteristics of the PWM feedback control units can be uniformed among a plurality of switching power supplies.

FIG. 11 is a diagram for showing a correction table according to a fifth embodiment. The correction table shown in FIG. 11 is provided in the parameter controller 10B shown in FIG. 9. In this case, the correction table shown in FIG. 11 is provided for each parameter No. of the current table shown in FIG. 3. Likewise, the correction table shown in FIG. 11 is provided for each parameter No. of the voltage table shown in FIG. 10. It should be noted that the voltage feedback parameters 1_C and 2_C need not be provided in the correction table provided for each parameter No. of the current table. Likewise, the current feedback parameters 1_C and 2_C need not be provided in the correction table provided for each parameter No. of the voltage table.

The parameter controller 10B selects a parameter No. from the current table shown in FIG. 3, and writes the current control parameters 1 and 2 corresponding to the selected parameter No. into the current feedback controller 3. At this time, however, the parameter controller 10B selects the current feedback parameters 1_C and 2_C from the correction table corresponding to the selected parameter No., writes the selected current feedback parameter 1_C together with the current control parameter 1 into the current feedback controller 3, and writes the selected current feedback parameter 2_C together with the current control parameter 2 into the current feedback controller 3. The selected current feedback parameter 1_C functions as a correction parameter for the current control parameter 1, and the current feedback parameter 2_C functions as a correction parameter for the current control parameter 2.

Likewise, the parameter controller 10B selects a parameter No. from the voltage table shown in FIG. 10, and writes the voltage control parameters 1 and 2 corresponding to the selected parameter No. into the voltage feedback controller 2. At this time, however, the parameter controller 10B selects the voltage feedback parameters 1_C and 2_C from the correction table corresponding to the selected parameter No., writes the selected voltage feedback parameter 1_C together with the voltage control parameter 1 into the voltage feedback controller 2, and writes the selected voltage feedback parameter 2_C together with the voltage control parameter 2 into the voltage feedback controller 2. The selected voltage feedback parameter 1_C functions as a correction parameter for the voltage control parameter 1, and the voltage feedback parameter 2_C functions as a correction parameter for the voltage control parameter 2.

In the correction table, the current feedback parameters 1_C and 2_C and the voltage feedback parameters 1_C and 2_C are set for each correction value. In the example of FIG. 11, −9%, −6%, −3%, Default, +3%, +6%, and +9% are set as the correction values, and each current feedback parameter and each voltage feedback parameter are set. The selection of a current feedback parameter and a voltage feedback parameter from the correction table is not particularly limited, but is made by selecting a correction value.

What correction value is selected when selecting a parameter No. from the current table is determined by, for example, monitoring the ripple level as will be described below.

Namely, a correction value is selected so that the ripple level of the output voltage Vout of the switching power supply 100 falls within a target level in predetermined conditions. For example, in the example of the parameter No.#1 of the current table, the current control parameters 1 and 2 corresponding to the parameter NO.#1 and the current feedback parameters 1_C and 2_C corresponding to Default of the correction value are written into the current feedback controller 3 to measure the ripple level. If the ripple level falls within the target level as a result of the measurement, Default is thereafter selected as the correction value. On the contrary, if the ripple level does not fall within the target level as a result of the measurement, the ripple level is measured by changing the correction value. The correction value at which the ripple level falls within the target level is defined by repeating the similar operation thereafter. When the parameter No.#1 is selected in the switching power supply 100 thereafter, the correction value at which the ripple level falls within the target level is selected from the correction table.

The correction values are similarly selected even from the correction table corresponding to each of the parameter Nos.#2 to #9 of the current table and the correction table corresponding to each of the parameter Nos. #1 to #9 of the voltage table. The selected correction values are written into the current feedback controller 3 and the voltage feedback controller 2 when the corresponding parameter Nos. are selected in the switching power supply 100 thereafter.

The selection of a correction value using the above-described ripple level is executed at the stage of, for example, producing the semiconductor device 1. Accordingly, variations can be reduced by trimming the characteristics of the PWM feedback control units among the plural semiconductor devices 1.

Modified Example

A case in which a correction value is selected at the stage of producing the semiconductor device 1 has been described above. The characteristics of a semiconductor device are subject to a secular change. When the ripple level does not fall within the target level due to a secular change, the selection of a correction value is made.

For example, an operation similar to the above may be executed so that the ripple level falls within the target level at the timing of activation of the cell motor (activation of the semiconductor device 1).

An example of providing the table shown in FIG. 11 for each parameter No. in the current table and the voltage table has been described above. However, the present invention is not limited to this. Namely, a correction register may be provided for each parameter No. to store the current feedback parameters 1_C and 2_C and the voltage feedback parameters 1_C and 2_C of the correction values. In this case, it is not necessary to provide the correction table for each parameter No., and thus the semiconductor device 1 can be downsized.

Sixth Embodiment

In each of the first to fifth embodiments, an example in which the current table (voltage table) is provided in the parameter controller 10 (10A and 10B) to set the parameters in these tables has been described.

In the embodiment, the table is configured using a plurality of internal registers provided in the parameter controller 10 in the first to fifth embodiments, and a processor 60A stores the parameters into the internal registers.

Figure 12:
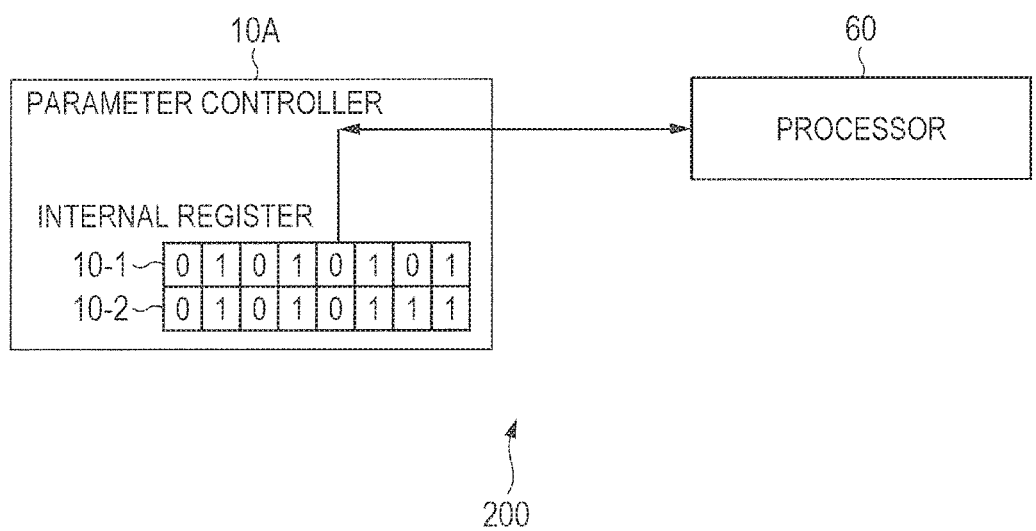
FIG. 12 is a diagram for showing a configuration of a power supply system according to a sixth embodiment.

FIG. 12 is a diagram for showing a configuration of a power supply system according to a sixth embodiment. The power supply system includes a plurality of circuit blocks as shown in FIG. 7, but only the parameter controller 10A and the processor 60 necessary for explanation are shown in FIG. 12. The parameter controller 10A includes a plurality of internal registers configuring a current table. FIG. 12 representatively illustrates internal registers 10-1 and 10-2.

The processor 10 writes current parameters 1 and 2 into the internal registers 10-1 and 10-2 through the interface circuit 24 (FIG. 7). When changing the characteristics of the current feedback controller 3, the parameter controller 10A reads the current parameters 1 and 2 written in the internal registers 10-1 and 10-2, and writes the same into the current feedback controller 3. It should be noted that the processor 60 writes the current parameters into the internal registers 10-1 and 10-2 before changing the characteristics of the PWM feedback control unit in the switching power supply 100.

An example of the current table has been described in the embodiment, but the same applies to the voltage table and the correction table.

Modified Example

In a modified example, the parameter controller 10A includes an electrically-rewritable non-volatile memory (for example, a flash memory). The processor 60A and the like write the current parameters into the non-volatile memory in the parameter controller 10A. Accordingly, the characteristics of the PWM feedback control unit can be dynamically changed when a state in which the power supply voltage (for example, the battery voltage Vin) is not fed to the semiconductor device 1 is changed to a state in which the power supply voltage is fed. In this case, it is obvious that the voltage table and the correction table may be similarly configured using the non-volatile memory.

The first to third embodiments have been described using the current control parameters 1 and 2 as an example. However, the voltage control parameters 1 and 2 may be used instead of the current control parameters 1 and 2.

In the specification, a parameter related to the current feedback controller 3 is referred to as a first parameter, and a parameter related to the voltage feedback controller 2 is referred to as a second parameter in some cases. For example, the current control parameters 1 and 2 are collectively referred to as first parameters, and the voltage control parameters 1 and 2 are collectively referred to as second parameters in some cases.

The invention achieved by the inventors has been concretely described above on the basis of the embodiments. However, it is obvious that the present invention is not limited to the above-described embodiments, and can be variously changed without departing from the scope thereof.

What is claimed is:

1. A power supply voltage stabilizing method of a power supply circuit comprising a switch to which a battery voltage is supplied and a PWM feedback control unit that controls the switch, wherein the PWM feedback control unit includes a voltage feedback controller that controls on the basis of a power supply voltage output from the power supply circuit and a current feedback controller that controls on the basis of a current output from the power supply circuit, wherein a variation in the battery voltage and/or a change in the load condition of the power supply circuit are/is detected, and wherein the bandwidth of the PWM feedback control unit is dynamically changed in accordance with the result of the detection.

2. The power supply voltage stabilizing method according to claim 1, wherein the detection is performed on the basis of the battery voltage and/or an output current of the power supply circuit.

3. The power supply voltage stabilizing method according to claim 2, wherein the current feedback controller is a variable-type current feedback controller the characteristics of which are changed in accordance with a first parameter, and the first parameter is changed in accordance with the result of the detection.

4. The power supply voltage stabilizing method according to claim 3, wherein the power supply circuit preliminarily stores a plurality of first parameters that is different from each other, and selects one of the first parameters to be supplied to the current feedback controller in accordance with the result of the detection.

5. The power supply voltage stabilizing method according to claim 2, wherein the voltage feedback controller is a variable-type voltage feedback controller the characteristics of which are changed in accordance with a second parameter, and the second parameter is changed in accordance with the result of the detection.

6. The power supply voltage stabilizing method according to claim 4,
wherein the power supply circuit preliminarily stores a plurality of second parameters that is different from each other, and selects one of the second parameters to be supplied to the voltage feedback controller in accordance with the result of the detection.

7. The power supply voltage stabilizing method according to claim 5,
wherein the ripple level of the power supply voltage output from the power supply circuit is detected to change the first parameter by which the characteristics of the current feedback controller are defined and/or the second parameter by which the characteristics of the voltage feedback control unit are defined.

8. The power supply voltage stabilizing method according to claim 7,
wherein the first parameter and/or the second parameter are/is automatically changed in accordance with the result of the detection of the ripple level of the power supply voltage.

9. The power supply voltage stabilizing method according to claim 5,
wherein each of the first parameter and the second parameter includes a parameter by which a gain is defined and a parameter by which a phase is defined.

10. A semiconductor device comprising:
a pulse width modulator that outputs a pulse width signal in accordance with a difference between an output voltage and a target voltage;
a voltage feedback controller;
a variable-type current feedback controller the characteristics of which are changed in accordance with a first parameter; and
a parameter controller in which a plurality of first parameters that is different from each other is preliminarily set,
wherein in accordance with a battery detection signal on the basis of a battery voltage supplied to a switch controlled by the pulse width signal and a current detection signal on the basis of a current output through the switch, the parameter controller selects one of the preliminarily-set first parameters to be set to the current feedback controller.

11. The semiconductor device according to claim 10,
wherein the voltage feedback controller is a variable-type voltage feedback controller the characteristics of which are changed in accordance with a second parameter, and
wherein a plurality of second parameters that is different from each other is preliminarily set to the parameter controller, and the parameter controller selects one of the preliminarily-set second parameters to be set to the voltage feedback controller.

12. The semiconductor device according to claim 11,
wherein a difference between the output voltage on the basis of a battery voltage through the switch and the target voltage is supplied to the voltage feedback controller,
wherein a difference between the current detection signal and an output of the voltage feedback controller is supplied to the current feedback controller, and wherein the pulse width modulator outputs a pulse width signal in accordance with an output of the current feedback controller.

13. The semiconductor device according to claim 12,
wherein each of the first parameter and the second parameter includes a parameter by which a gain is defined and a parameter by which a phase is defined.

14. The semiconductor device according to claim 13, further comprising an interface circuit that is coupled to the parameter controller to serve as an interface for a signal between the outside of the semiconductor device and the parameter controller.

15. The semiconductor device according to claim 14,
wherein the current feedback controller, the voltage feedback controller, the switch, and the interface circuit are formed in one semiconductor chip.

16. A power supply system comprising a semiconductor device and a processor coupled to the semiconductor device,
wherein the semiconductor device includes:
a pulse width modulator that outputs a pulse width signal in accordance with a difference between an output voltage and a target voltage;
a voltage feedback controller;
a variable-type current feedback controller the characteristics of which are changed in accordance with a first parameter;
a parameter controller that sets the first parameter to the current feedback controller; and
an interface circuit that is coupled to the parameter controller and the processor, and
wherein in accordance with a battery detection signal on the basis of a battery voltage supplied to a switch controlled by the pulse width signal and a current detection signal on the basis of a current output through the switch, the parameter controller sets the first parameter to the current feedback controller.

17. The power supply system according to claim 16,
wherein the voltage feedback controller is a variable-type voltage feedback controller the characteristics of which are changed in accordance with a second parameter, and
wherein the parameter controller sets the second parameter to the voltage feedback controller.

18. The power supply system according to claim 16,
wherein the parameter controller sets the first parameter in accordance with an instruction from the processor to the current feedback controller.

19. The power supply system according to claim 18,
wherein a difference between the output voltage on the basis of a battery voltage through the switch and the target voltage is supplied to the voltage feedback controller,
wherein a difference between the current detection signal and an output of the voltage feedback controller is supplied to the current feedback controller, and
wherein the pulse width modulator outputs a pulse width signal in accordance with an output of the current feedback controller.

20. The power supply system according to claim 17,
wherein each of the first parameter and the second parameter includes a parameter by which a gain is defined and a parameter by which a phase is defined.

* * * * *